United States Patent

Ohtaki et al.

[11] Patent Number: 5,633,709
[45] Date of Patent: May 27, 1997

[54] PROPAGATION DELAY TIME MEASURING DEVICE

[75] Inventors: Toshiyuki Ohtaki; Yu Sato, both of Tokyo, Japan

[73] Assignee: Ando Electric Co., Ltd., Tokyo, Japan

[21] Appl. No.: 687,036

[22] Filed: Jul. 25, 1996

[30] Foreign Application Priority Data

Aug. 11, 1995 [JP] Japan .................... 7-227085

[51] Int. Cl.$^6$ ........................................ G01N 21/00
[52] U.S. Cl. ........................................ 356/73.1
[58] Field of Search ................ 356/73.1; 174/103; 333/236, 241; 307/591, 590, 288

[56] References Cited

U.S. PATENT DOCUMENTS

4,838,690  6/1989  Buckland et al. ............... 356/73.1
5,214,318  5/1993  Nakamishi et al. .............. 307/303

*Primary Examiner*—Frank Gonzalez
*Assistant Examiner*—Reginald A. Ratliff
*Attorney, Agent, or Firm*—Finnegan, Henderson, Farabow, Garrett & Dunner, L.L.P.

[57] ABSTRACT

A propagation delay time measuring device has a test signal generating circuit, a time measuring circuit, a data table and a calculation circuit. The test signal generating circuit generates a test signal and supplies the test signal to a measuring point which is connected to one of the terminals of a signal transmission line. The time measuring circuit receives a signal waveform at the measuring point. The signal waveforms indicates an waveform of the test signal supplied to one of the terminals of the signal transmission line and a waveform reflected by another terminal of the signal transmission line and returned to the measuring point. The time measuring circuit measures a time when the test signal is supplied to the measuring point and a time when the reflected waveform is returned to the measuring point based on the signal waveform at the measuring point. The data table stores correct data made up of propagation delay time data and measurement error data which are obtained by a simulation of the signal transmission line. The calculation circuit calculates a propagation delay time of the signal transmission line based on the times measured by the time measuring circuit and corrects the calculated propagation delay time based on the data table.

2 Claims, 8 Drawing Sheets

| Loss | L | Trfl | Terror |
|------|-----|---------|----------|
| 0.4 | 2.0 | 21.0447 | -88.908 |
| 0.4 | 2.5 | 26.1684 | -101.4409 |
| ⋮ | ⋮ | ⋮ | ⋮ |
| 0.5 | 1.5 | 16.0083 | -93.4588 |
| 0.5 | 2.0 | 21.1582 | -111.3106 |
| ⋮ | ⋮ | ⋮ | ⋮ |

PROPAGATION DELAY TIME MEASURING DEVICE

BACKGROUND OF THE INVENTION

1. Field of the Invention

The present invention relates to a propagation time measuring device for measuring propagation delay times of signal transmission lines in a TDR (Time Domain Reflectometer) method.

2. Background Art

Description will be given with respect to a conventional device for measuring propagation delay times of signal transmission lines with reference to FIGS. 6–9c.

Figure 6:
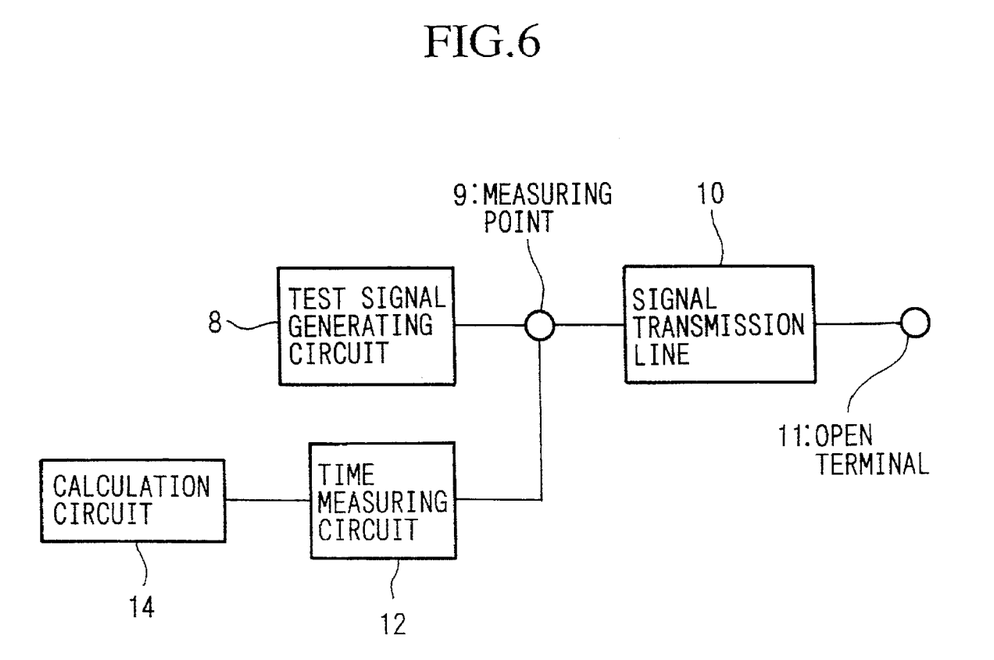
FIG. 6 is a block diagram showing the configuration of a conventional propagation delay time measuring device.
Figure 7:
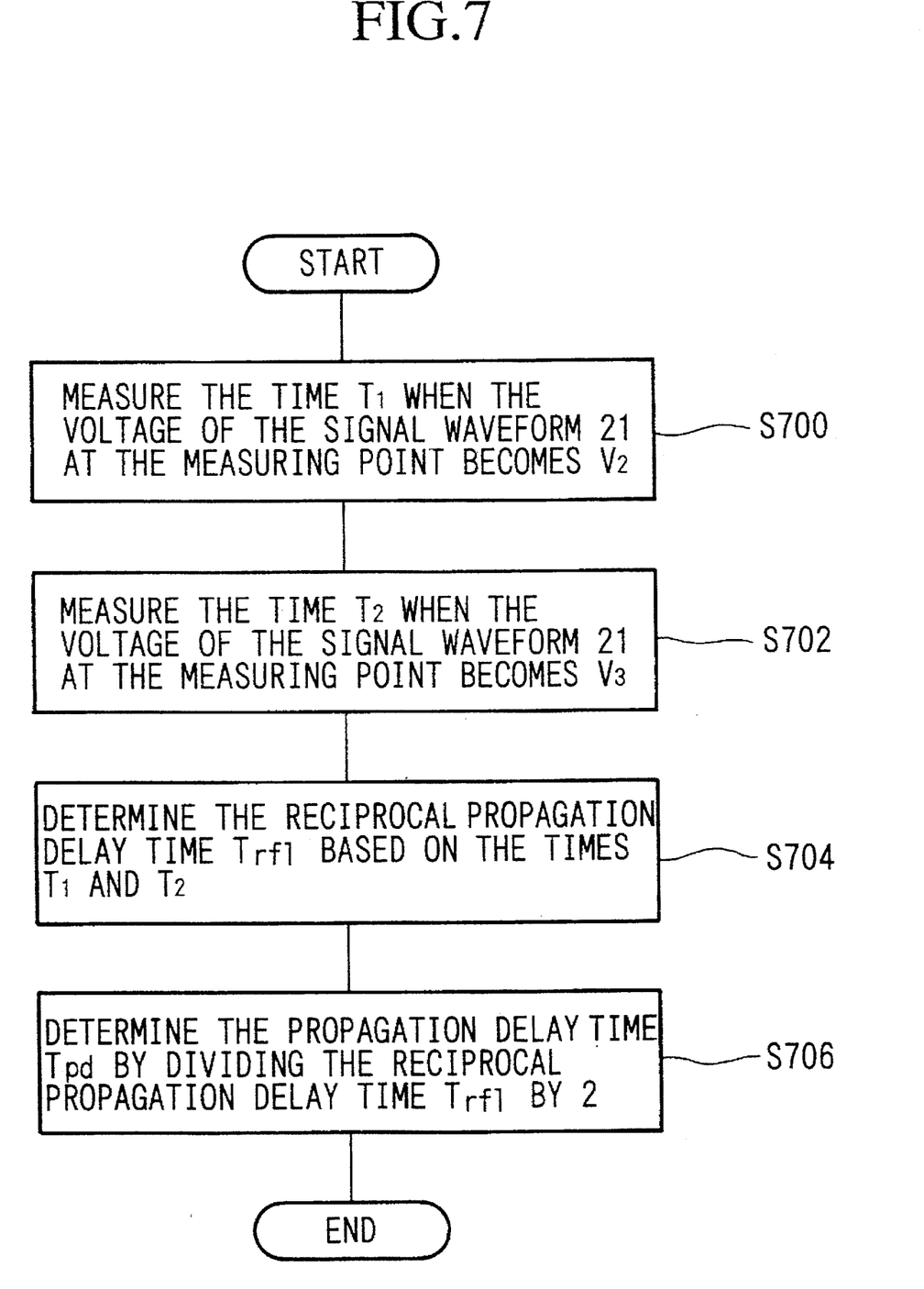
FIG. 7 is a flow chart showing the operation of the conventional propagation delay time measuring device.
Figure 8A:
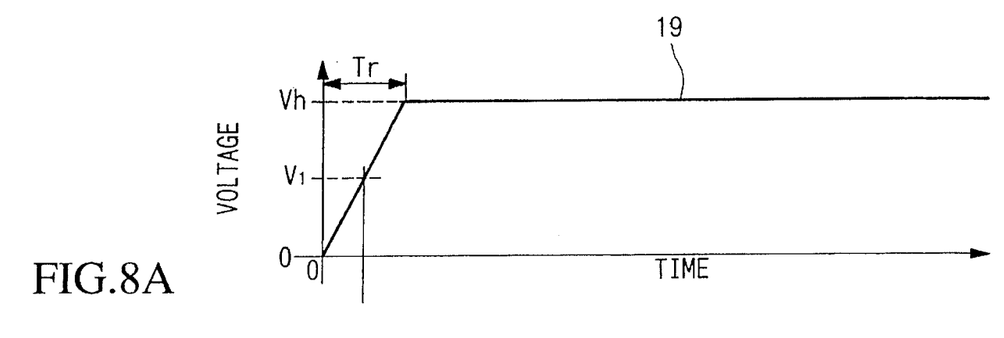
FIGS. 8A–8C are waveform charts showing signal waveforms detected through the procedure of the conventional propagation delay time measuring device.
Figure 8B:
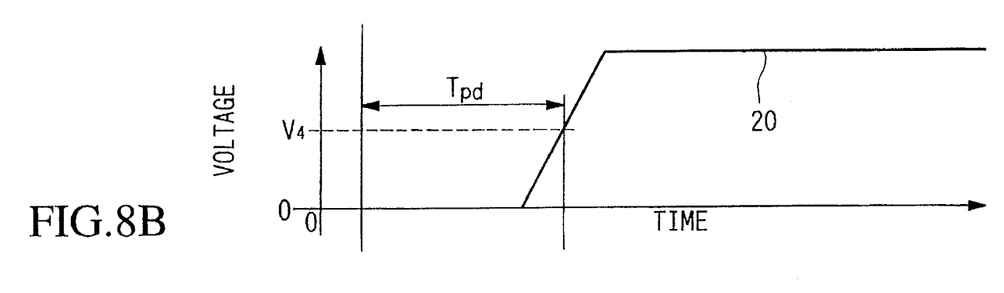
Figure 8C:
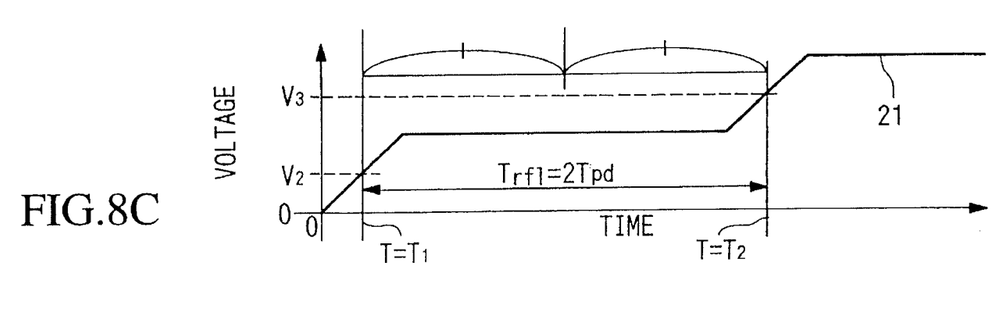

FIG. 6 is a block diagram showing the configuration of a conventional propagation delay time measuring device. FIG. 7 is a flow chart showing a propagation delay time measuring procedure carried out by the device shown in FIG. 6. FIGS. 8A–8C show signal waveforms which are detected in the operation of the system.

In FIG. 6, 8 designates a test signal generating circuit; 9 designating a measuring point at which a signal waveform is to be detected; 10 designates a signal transmission line; 11 designates a open terminal of the signal transmission line; 12 designates a time measuring circuit for measuring times when the voltage of the signal at the measuring point 9 becomes predetermined reference voltages; and 14 designates a calculation circuit for calculating a propagation delay time of the signal transmission line 10 based on the times measured by the time measuring circuit 12.

In FIGS. 8A–8C, 19 designates a waveform of a test signal which is generated by the test signal generating circuit 8 and has a maximum voltage Vh, and a minimum voltage 0 V, and a rise time Tr; 20 designates a signal waveform at the open terminal 11; and 21 designates a signal waveform at the measuring point 9.

Next, the operation of the conventional propagation delay time measuring device will be described according to the flow chart shown in FIG. 7.

In step S700, the test signal generating circuit 8 supplies the test signal 19 to the signal transmission line 10, and the time measuring circuit 12 measures a time $T_1$ when the voltage of signal waveform 21 at the measuring point 9 becomes a reference voltage $V_2$ in order to determine a time when the test signal is substantially supplied to the signal transmission line 10.

Next, in step S702, the time measuring circuit 12 measures a time $T_2$ when the voltage of the signal waveform 21 at the time measuring point 9 becomes a reference voltage $V_3$ in order to determine a time at which a reflected waveform from the open terminal 11 is returned to the measuring point 9.

Next, in step S704, the calculation circuit 14 calculates a difference $T_2-T_1$ as a reciprocal propagation delay time $T_{rfl}$ for reciprocating the test signal through the signal transmission line 10.

Next, in step S706, the calculation circuit 14 divides the reciprocal propagation delay time $T_{rfl}$ by 2 to determine a propagation delay time $T_{pd}$ for transmitting the test signal from the measuring point 9 to the open terminal 11 through the signal transmission line 10.

The conventional device assumes an ideal condition in which the test signal propagates through the transmission line with no attenuation. In actual signal transmission, however, the test signal is attenuated when propagating through the signal transmission line. Therefore, the conventional device has a problem in that the large measurement error due to the attenuation of the test signal is generated in the measurement of the propagation delay time and it is difficult to accurately determine the propagation delay time.

Figure 9A:
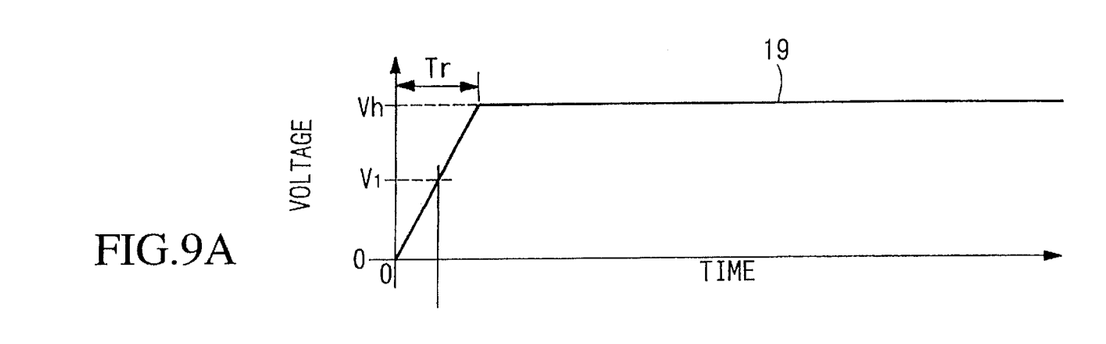
FIGS. 9A–9C are waveform charts showing a problem of the conventional propagation delay time measuring device.
Figure 9B:
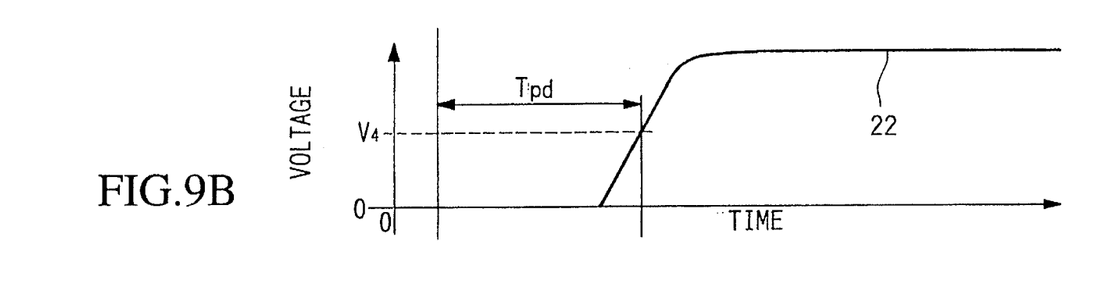
Figure 9C:
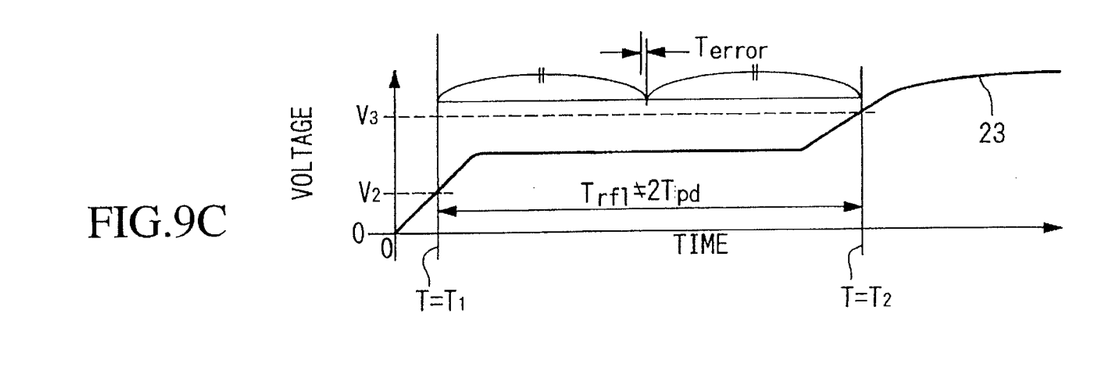

Next, description will be given with respect to this problem referring to FIGS. 9A–9C. FIGS. 9A–9C show signal waveforms which are obtained in the measuring device. In FIGS. 9A–9C, 22 designates a signal waveform which is detected at the open terminal 11; and 23 designates a signal waveform which is detected at the measuring point 9. In the case shown in FIGS. 9A–9C, the signal is transmitted through the signal transmission line 10 with an attenuation. Therefore, the slopes of the signal waveforms 22 and 23 are curved due to the attenuation.

In this case, the reciprocal propagation delay time $T_{rfl}$ does not equal twice the propagation delay time $T_{pd}$. Thus, the propagation delay time $T_{pd}$ is measured with a measurement error $T_{error}$. For example, the measurement error $T_{error}$ has a value of several tens of ps when the propagation delay time to be measured is several ns.

SUMMARY OF THE INVENTION

Accordingly, it is an object of the present invention to provide a propagation delay time measuring device to accurately measure a propagation delay time of a signal transmission line even if the signal is attenuated in the signal transmission line.

In an aspect of the present invention, there is provided a propagation delay time measuring device comprising a test signal generating circuit for generating a test signal and for supplying the test signal to a measuring point which is connected to one of terminals of a signal transmission line; a time measuring circuit for receiving a signal waveform at the measuring point which indicates an waveform of the test signal supplied to one of the terminals of the signal transmission line and a waveform reflected by another terminal of the signal transmission line and returned to the measuring point, and for measuring a time when the test signal is supplied to the measuring point and a time when the reflected waveform is returned to the measuring point based on the signal waveform at the measuring point; a data table for storing correct data made up of propagation delay time data and measurement error data which are obtained by a simulation of the signal transmission line; and a calculation circuit for calculating a propagation delay time of the signal transmission line based on the times measured by the time measuring circuit and for correcting the calculated propagation delay time based on the data table.

DETAILED DESCRIPTION OF THE PREFERRED EMBODIMENTS

Hereinbelow, preferred embodiments of the present invention will be explained with reference to the Figures.

Figure 1:
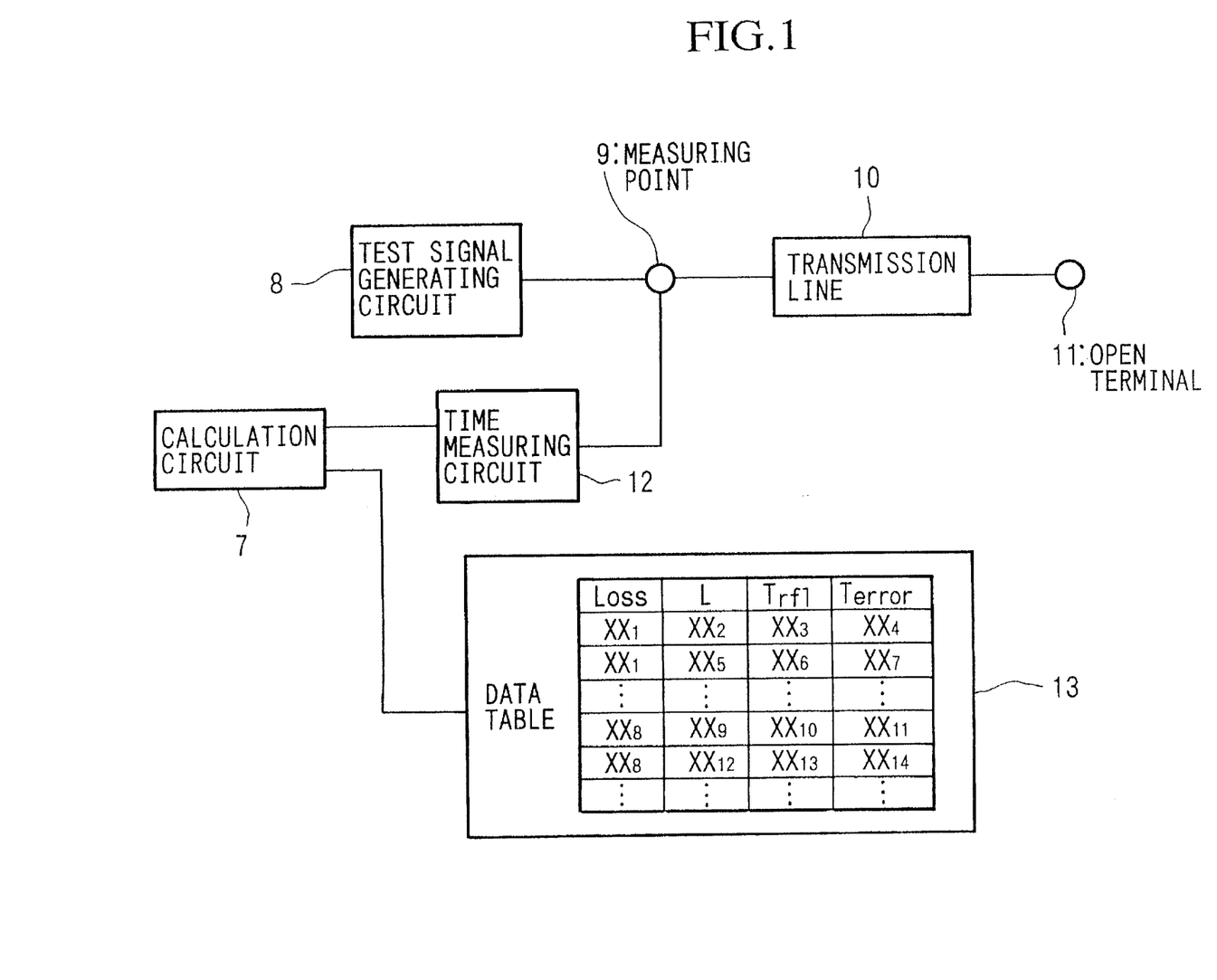
FIG. 1 is a block diagram showing the configuration of a propagation delay time measuring device according to a preferred embodiment of the present invention.

FIG. 1 is a block diagram showing the configuration of a propagation delay time measuring device according to a preferred embodiment of the present invention. The members which are identical to those of the conventional system shown in FIG. 6 are designated by the same reference numerals as those of the propagation delay time measuring device, and the description thereof will therefore be omitted.

In the propagation delay time measuring device shown in FIG. 1, a calculation circuit 7 is provided instead of the calculation circuit 14 shown in FIG. 6, and a data table 13 is added.

The data table 13 stores correct data including reciprocal propagation delay data and measurement error data which are used for correcting the measurement errors of the propagation delay times.

In order to prepare the data table 13, a simulation is carried out using a circuit model corresponding to the circuit shown in FIG. 1 to determine the reciprocal propagation delay time data of the circuit model and the measurement error data which are the difference between the propagation delay time obtained by the simulation and the propagation delay times which are to be obtained by the conventional propagation delay time measuring method.

The conditions of the simulation were as follows:

a. The rise time Tr of a test signal model corresponding to the test signal 19 is fixed to a predetermined value.

b. A plurality of attenuation data $XX_1$, $XX_8$ ... are supposed as an attenuation data Loss of the signal transmission line to be simulated. The simulation is carried out for these attenuation data Losses.

c. In the simulation corresponding to each attenuation data Loss, reciprocal propagation delay times are calculated changing the length L of the signal transmission line 10.

The calculation circuit 7 calculates the propagation delay time of the signal transmission line 10 using the data thus stored in the data table 13.

Figure 2:
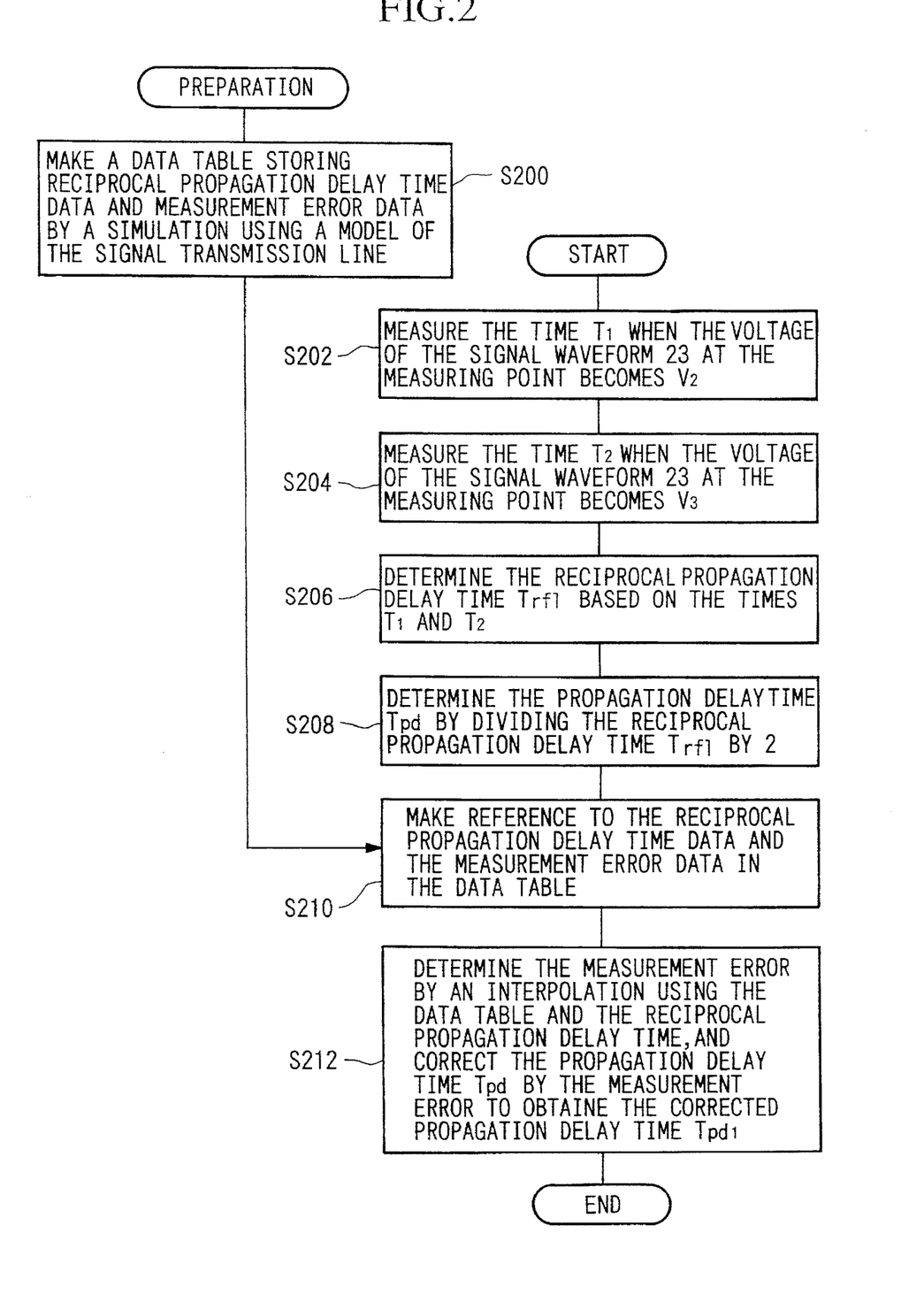
FIG. 2 is a flow chart showing the operation of the propagation delay time measuring device.

FIG. 2 is a flow chart showing a propagation delay time measuring procedure carried out by the system. The procedure is constituted by operations of steps S200–S212. The calculation circuit 7 executes the steps S206–S212.

Next, the operation of the propagation delay time measuring device will be described with reference to FIG. 2.

In step S200, the data table 13 is prepared as described above. After this preparation, the measurement is started.

In step S202, the test signal generating circuit 8 supplies the test signal 19 to the signal transmission line 10, and the time measuring circuit 12 measures a time $T_1$ when the voltage of signal waveform 23 at the measuring point 9 becomes a reference voltage $V_2$ in order to determine a time when the test signal is substantially supplied to the signal transmission line 10.

Next, in step S204, the time measuring circuit 12 measures a time $T_2$ when the voltage of the signal waveform 23 at the time measuring point 9 becomes a reference voltage $V_3$ in order to determine a time when a reflected signal from the open terminal 11 is returned to the measuring point 9.

Next, In step S206, the calculation circuit 7 determines a difference $T_2-T_1$, and determines a reciprocal propagation delay time $T_{rfl}$ for reciprocating the test signal through the signal transmission line 10 based on the difference $T_2-T_1$.

Next, in step S208, the calculating circuit 7 determines a propagation delay time $T_{pd}$ of the signal transmission line by dividing the reciprocal propagation delay time $T_{rfl}$ by two.

Next, in step S210, the calculation circuit 7 makes reference to the data table 13, and selects some data to be used for the calculation of the propagation delay time as follows:

a. First, the calculation circuit 7 searches for the two attenuation data in the data table 13 which are nearest to the attenuation data Loss of the signal transmission line 10. That is to say, if the attenuation data $XX_1$ and $XX_8$ shown In FIG. 1 are nearest to the attenuation data Loss (for example, $XX_1<Loss<XX_8$), the attenuation data $XX_1$ and $XX_8$ are searched for.

b. Next, the calculation circuit 7 selects four reciprocal propagation delay time data in the data table 13 which correspond to the attenuation data $XX_1$ or $XX_8$ and are nearest to the measured reciprocal delay time $T_{rfl}$ which has been obtained in step S206. That is to say, if the data $XX_3$, $XX_6$, $XX_{10}$ and $XX_{13}$ shown in FIG. 1 are nearest to the measured reciprocal delay time $T_{rfl}$ (for example, $XX_3<T_{rfl}<XX_6$, $XX_{10}<T_{rfl}<XX_{13}$), the data $XX_3$, $XX_6$, $XX_{10}$ and $XX_{13}$ are selected. Furthermore, the four measurement error data $XX_4$, $XX_7$, $XX_{11}$ and $XX_{14}$ respectively corresponding to the selected reciprocal propagation delay time data $XX_3$, $XX_6$, $XX_{10}$ and $XX_{13}$ are selected.

Next, in step S212, the calculation circuit 7 determines measurement errors $T_{error}(XX_1)$ and $T_{error}(XX_8)$ which respectively correspond to the attenuation data $XX_1$ and $XX_8$ by a linear interpolation using the measured reciprocal propagation delay time $T_{rfl}$ and the reciprocal propagation delay time data selected in the step S210. The following equations (1) and (2) define the linear interpolation.

$$T_{error}(XX_1)=\{(T_{rfl}-XX_3)(XX_7-XX_4)/(XX_6-XX_3)\}+XX_4 \quad \ldots (1)$$

$$T_{error}(XX_8)=\{(T_{rfl}-XX_{10})(XX_{14}-XX_{11})/(XX_{13}-XX_{10})\}+XX_{11} \cdot \cdot (2)$$

Next, the calculation circuit 7 calculates a measurement error correct data $T_{error1}$ to correct the measurement by a linear interpolation using the measurement error data $T_{error}(XX_1)$ and $T_{error}(XX_8)$ corresponding to the attenuation data $XX_1$ and $XX_8$. The following equation (3) defines the interpolation.

$$T_{error1} = \{(T_{error}(XX_8) - T_{error}(XX_1))(Loss - T_{error}(XX_1))/(XX_8 - XX_1)\} + T_{error}(XX1) \quad (3)$$

In the above equation (3), Loss is the attenuation data of the signal transmission line 10.

Next, the calculation circuit 7 subtracts the measurement error correct data $T_{error1}$ from the propagation delay time $T_{pd}$ which has been obtained in step S208. As a result, the measurement error of the propagation delay time $T_{pd}$ is reduced and the propagation delay data having very little measurement error is obtained.

Next, a concrete example of the propagation delay time measuring device described above will be described with reference to FIGS. 3–5.

Figure 3:
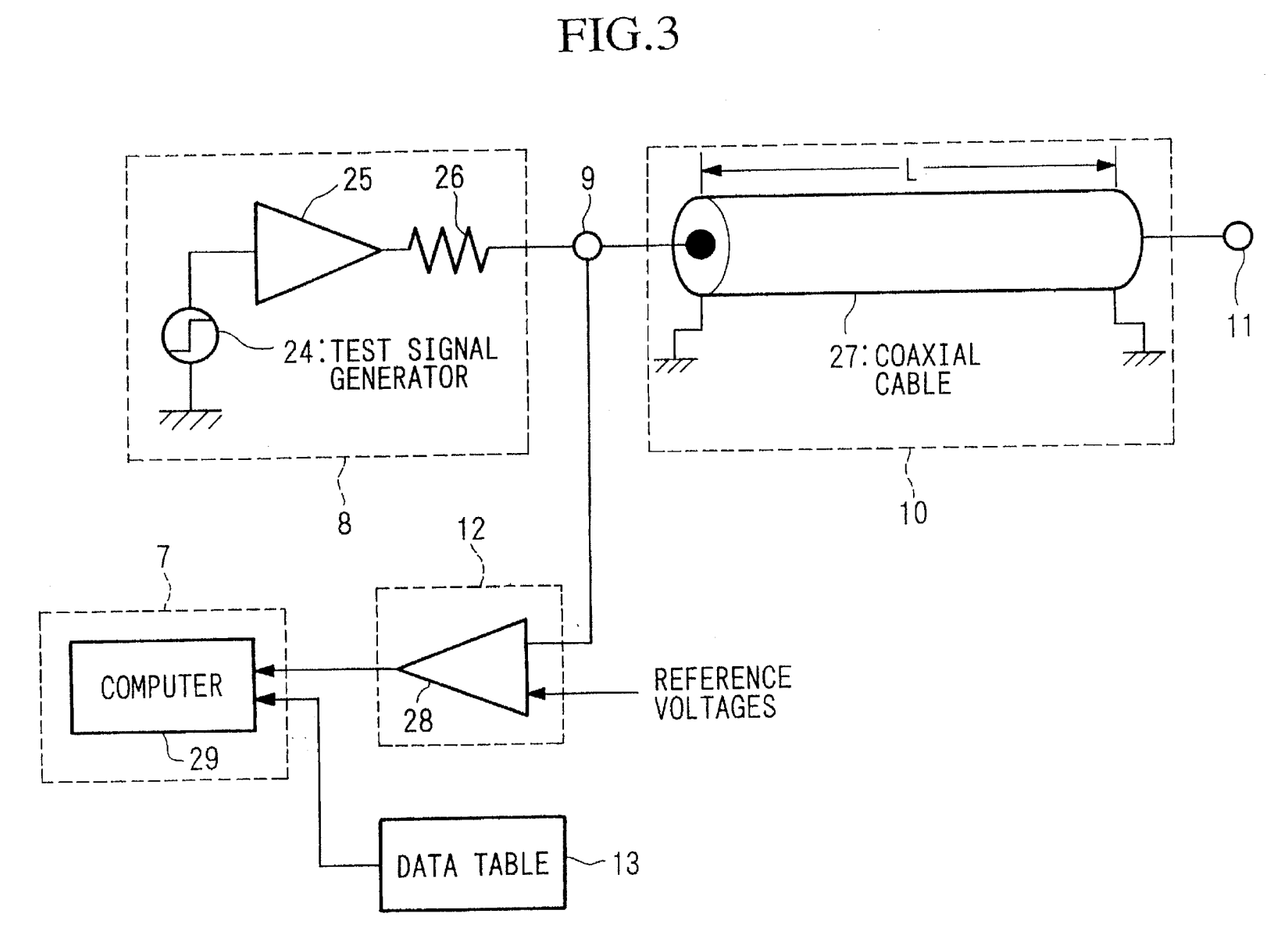
FIG. 3 is a circuit diagram showing the configuration of a concrete example of the propagation delay time measuring device.

FIG. 3 is a circuit diagram of the concrete example of the propagation delay time measuring system shown in FIG. 1. The members which are identical to those of the system shown in FIG. 1 are designated by the same reference numerals.

In FIG. 3, the test signal generating circuit 8 is made up of a test signal generator 24, an amplifier 25 having a gain 1, a resistor 26 having a resistance 50 D. The signal transmission line 10 is made up of a coaxial cable 27. The length of the coaxial cable 27 is 2 meter and the attenuation data Loss at the frequency fo (=100 MHz) is 0.45 dB/m.

The time measuring circuit 12 is made up of a comparison circuit 28. The reference voltage $V_2$, the value of which is 0.25 V, and the reference voltage $V_3$, the value of which is 0.75 V, are supplied to the comparison circuit 28.

Figure 5:
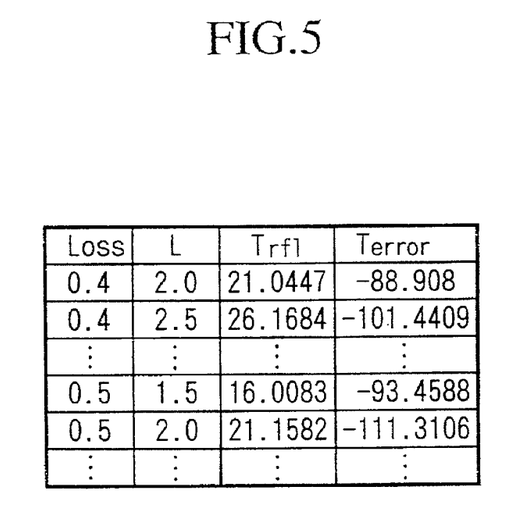
FIG. 5 shows an example of a data table used for the propagation delay time measuring device.

The data table 13 includes a plurality of reciprocal propagation delay time data $T_{rfl}$ and measurement error data $T_{error}$ corresponding to the delay times. FIG. 5 shows a part of the content of the data table 13. The reciprocal propagation delay times and the measurement errors are obtained by a simulation which is carried out in the following condition:

a. The length L of the coaxial line 28 is selected from among 1.5 m, 2 m, and 2.5 m.
b. The attenuation data Loss at the frequency fo (=100 MHz) is selected from among 0.4 dB/m and 0.5 dB/m.
c. The rise time Tr of the test signal 30 is fixed to 5 ns.

The calculation circuit 7 is made up of a computer 29. The computer 29 receives the compared result of the comparison circuit 28 and the read out data of the data table 13, and calculates the propagation delay time of the coaxial cable 27.

Figure 4A:
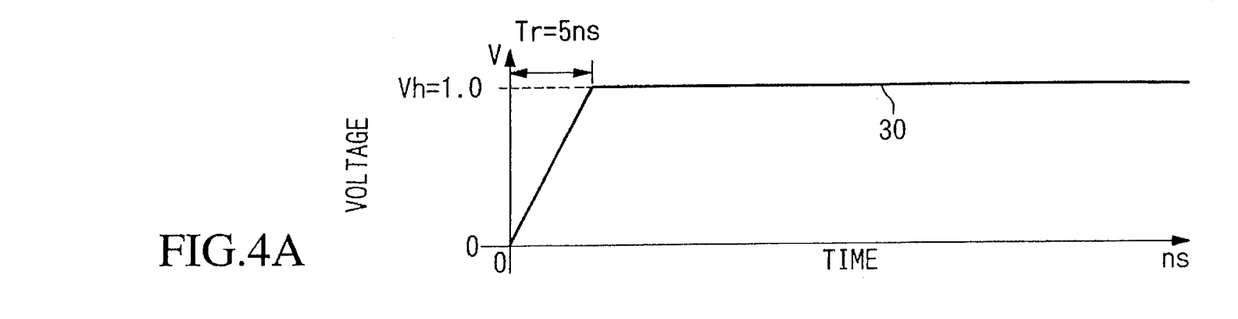
FIGS. 4A–4C are waveform charts showing signal waveforms detected through the procedure of the propagation delay time measuring device.
Figure 4B:
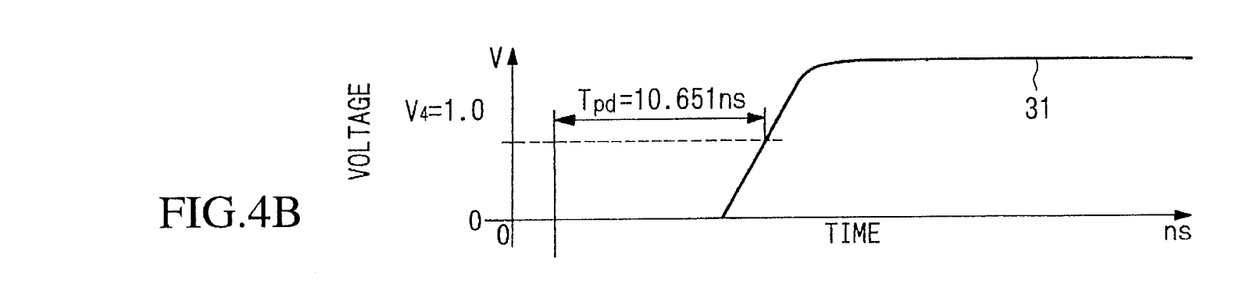
Figure 4C:
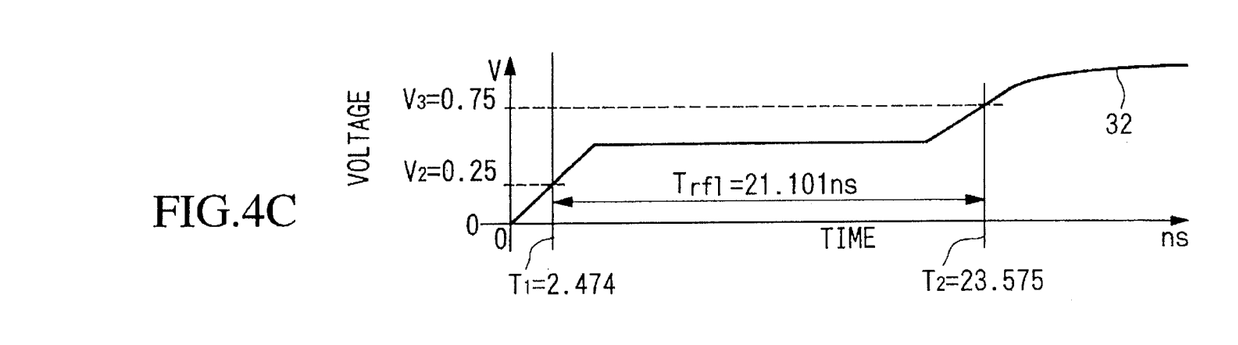

FIGS. 4A–4C show signal waveforms which are detected in the concrete example of the propagation delay time measuring device. In FIGS. 4A–4C, 30 designates a waveform of the test signal which has an amplitude of 1 V and a rise time of 5 ns; 31 designates a signal waveform detected at the open terminal 11; and 32 designates a signal waveform detected at the measuring point 9.

In this concrete example, the computer 29 calculates the propagation delay time of the coaxial cable 27 as follows:

As shown in FIGS. 4A–4C, the level of the waveform 32 at the measuring point becomes the reference voltage $V_2$ of 0.25 V at the time $T_1$ of 2.474 ns. Furthermore, the level reaches the reference voltage $V_3$ of 0.75 V at the time $T_2$ of 23.575 ns. Thus, the reciprocal propagation delay time $T_{rfl}$ (=$T_2-T_1$) is 21.101 ns. The propagation delay time $T_{pd}$ of the coaxial cable 27 is determined by the following equation (4) using the reciprocal propagation delay time.

$$T_{pd}=T_{rfl}/2=21.101/2=10.551 \text{ ns} \quad \ldots (4)$$

Next, the computer 29 searches two attenuation data in the data table 13 which are nearest to the attenuation data of the coaxial cable 27. In this case, the attenuation data of the coaxial cable is 0.45 dB/m. Therefore, the attenuation data 0.4 dB/m and 0.5 dB/m are obtained by this search.

Next, the computer 29 selects reciprocal propagation delay time data $T_{rfl}$ and the measurement error data $T_{error}$ in the data table 13 which correspond to the attenuation data 0.4 dB/m and are nearest to the measured reciprocal delay time $T_{rfl}$, i.e., 21.101 ns.

In this example, the combination of $T_{rfl}$=21.0447 and $T_{error}$=−88.908, and the combination of $T_{rfl}$=26.1684 and $T_{error}$=−101.4409 are selected at this stage.

Next, the linear interpolation is carried out by using the above $T_{rfl}$ and $T_{error}$ to determine the measurement error Terror(0.4) which corresponds to the attenuation data of 0.4 dB/m and the reciprocal propagation delay time $T_{rfl}$ of 21.101 ns. The following equation (5) defines this linear interpolation.

$$\begin{aligned}T_{error}(0.4) &= (21.101-21.0447)(-101.4409+88.908)/ \\ &\quad (26.1684-21.0447)-88.908 \\ &= -89.0457 \text{ ps}\end{aligned} \quad (5)$$

Next, the computer 29 selects reciprocal propagation delay time data $T_{rfl}$ and the measurement errors $T_{error}$ in the data table 13 which correspond to the attenuation data 0.5 dB/m and are nearest to the measured reciprocal delay time $T_{rfl}$ of 21.101 ns.

In this example, the combination of $T_{rfl}$=16.0083 and $T_{error}$=−93.4588, and the combination of $T_{rfl}$=21.1582 and $T_{error}$=−111.8106 are selected.

The linear interpolation is then carried out by using the above $T_{rfl}$ and $T_{error}$ to determine the measurement error Terror(0.5) which corresponds to the attenuation data of 0.5 dB/m and the reciprocal propagation delay time $T_{rfl}$ of 21.101 ns. The following equation (6) defines this linear interpolation.

$$\begin{aligned}T_{error}(0.5) &= (21.101-16.0083)(-111.3106+93.4588)/ \\ &\quad 21.1582-16.0083)-93.4588 \\ &= -111.1123 \text{ ps}\end{aligned} \quad (6)$$

Next, the measurement error correct data $T_{error1}$ is calculated by the linear interpolation using the measurement errors $T_{error}(0.4)$ and $T_{error}(0.5)$ as follows:

$$\begin{aligned}T_{error1} &= \{T_{error}(0.5)-T_{error}(0.4)\}(0.45-0.4)/ \\ &\quad (0.5-0.4)+T_{error}(0.4) \\ &= (-111.1123+89.0457)(0.45-0.4)/ \\ &\quad (0.5-0.4)-89.0457 \\ &= -100.079 \text{ ps}\end{aligned} \quad (7)$$

The measured propagation delay data $T_{pd}$ is then corrected by this measurement error correct data $T_{error1}$ and the corrected propagation delay time $T_{pd1}$ is calculated as follows:

$$\begin{aligned}T_{pd1} &= T_{pd}-T_{error1} \\ &= 10.551 \text{ ns}+0.100079 \text{ ns} \\ &= 10.651 \text{ ns}\end{aligned} \quad (8)$$

In this manner the measurement error is reduced and the propagation delay time $t_{pd1}$ is obtained.

What is claimed is:

1. A propagation delay time measuring device comprising:

a test signal generating circuit for generating a test signal and for supplying the test signal to a measuring point which is connected to one of terminals of a signal transmission line;

a time measuring circuit for receiving a signal waveform at the measuring point which indicates an waveform of the test signal supplied to one of the terminals of the signal transmission line and a waveform reflected by another terminal of the signal transmission line and returned to the measuring point, and for measuring a time when the test signal is supplied to the measuring point and a time when the reflected waveform is returned to the measuring point based on the signal waveform at the measuring point;

a data table for storing correct data made up of propagation delay time data and measurement error data which are obtained by a simulation of the signal transmission line; and     a calculation circuit for calculating a propagation delay time of the signal transmission line based on the times measured by the time measuring circuit and for correcting the calculated propagation delay time based on the data table.

2. A propagation delay time measuring device according to claim 1 wherein the correct data is made up of propagation delay time data and measurement error data corresponding to a plurality of attenuation losses of the signal transmission line, and the calculation circuit corrects the measured propagation delay time by a procedure comprising the steps of:

a. searching for the propagation delay time data and the measurement error data corresponding to two attenuation data which are nearest to an attenuation data of the signal transmission line from among the data table;

b. determining two measurement error data corresponding to the two attenuation data of the signal transmission line and the measured propagation delay time by an interpolation using the searched propagation delay time data and the searched measurement error data;

c. determining a measurement error data corresponding to the attenuation data of the signal transmission line by an interpolation using the two measurement error data obtained in the step b; and d. correcting the measured propagation delay time by the measurement error data obtained in the step c.

* * * * *